(12) United States Patent
Park

(10) Patent No.: US 8,455,942 B2
(45) Date of Patent: Jun. 4, 2013

(54) SEMICONDUCTOR DEVICE HAVING VERTICAL-TYPE CHANNEL

(75) Inventor: Jung-Woo Park, Ichon-shi (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 13/085,283

(22) Filed: Apr. 12, 2011

(65) Prior Publication Data

US 2011/0198688 A1   Aug. 18, 2011

Related U.S. Application Data

(60) Continuation of application No. 12/830,125, filed on Jul. 2, 2010, now Pat. No. 7,923,334, which is a division of application No. 11/479,439, filed on Jun. 29, 2006, now Pat. No. 7,749,844.

(30) Foreign Application Priority Data

Dec. 28, 2005 (KR) .......................... 10-2005-0132568

(51) Int. Cl.
*H01L 29/772* (2006.01)
(52) U.S. Cl.
USPC ...................... 257/330; 438/270; 257/E29.26
(58) Field of Classification Search
USPC .............................. 257/330, E29.26; 438/270
See application file for complete search history.

(56) References Cited

U.S. PATENT DOCUMENTS

| 6,262,917 | B1 | 7/2001 | Lee |
| 6,285,057 | B1 | 9/2001 | Hopper et al. |
| 6,362,025 | B1 | 3/2002 | Patti et al. |
| 2002/0030214 | A1 | 3/2002 | Horiguchi |
| 2004/0121546 | A1 | 6/2004 | Yoo |
| 2005/0006717 | A1 | 1/2005 | Yamaguchi et al. |
| 2005/0186746 | A1 * | 8/2005 | Lee et al. ...................... 438/300 |

FOREIGN PATENT DOCUMENTS

| JP | 08-064778 | 3/1996 |
| KR | 10-1996-0000229 B1 | 1/1996 |
| KR | 10-2004-0074501 A | 8/2004 |
| TW | 575924 | 2/2004 |
| TW | 587311 | 5/2004 |
| TW | 589705 | 8/2004 |
| TW | 122337 | 11/2004 |

* cited by examiner

*Primary Examiner* — Steven J Fulk
(74) *Attorney, Agent, or Firm* — Kilpatrick Townsend & Stockton LLP

(57) ABSTRACT

A semiconductor device includes an active region including a surface region and a first recess formed below the surface region, the active region extending along a first direction; a device isolation structure provided on an edge of the active region; a gate line traversing over the surface region of the active region along a second direction orthogonal to the first direction; a second recess formed in the device isolation structure to receive a given portion of the gate line into the second recess; a first junction region formed in the active region beneath the first recess and on a first side of the gate line; and a second junction region formed on a second side of the gate line and above the first junction region. The first and second junction regions define a vertical-type channel that extends along lateral and vertical directions.

6 Claims, 12 Drawing Sheets

I-I'

II-II'

SEMICONDUCTOR DEVICE HAVING VERTICAL-TYPE CHANNEL

CROSS-REFERENCE TO RELATED APPLICATIONS

The present invention is a continuation of U.S. Pat. No. 7,923,334, issued on Apr. 12, 2011, which is a divisional of U.S. Pat. No. 7,749,884, issued on Jul. 6, 2010, which claims priority to Korean patent application number 10-2005-0132568, filed on Dec. 28, 2005, all of which are incorporated herein by reference in their entirety.

BACKGROUND OF THE INVENTION

The present invention relates to a method for fabricating a semiconductor device, and more particularly to a semiconductor device having a vertical-type channel and a method for fabricating the same.

As the integration scale of semiconductor devices has been increased, an increase in cell electric charges and an improvement in a refresh property have a direct relationship with reliability of dynamic random access memory (DRAM) devices.

Furthermore, the DRAM devices use a cell having a horizontal-type channel. FIG. 1 illustrates a cross-sectional view of a conventional cell structure having a horizontal-type channel. The cell structure having the horizontal-type cell will be referred to as a horizontal channel cell.

As shown in FIG. 1, a plurality of gate lines, each formed by sequentially stacking a gate oxide layer 112, a gate oxide layer 113, and a gate hard mask 114 are formed over a substrate 111. A plurality of gate spacers 115 are formed on sidewalls of the gate lines, and a plurality of source/drain regions 116A and 116B are formed in the substrate 111 adjacent to the gate lines. A bit line BL is connected to the source/drain region 116A and a plurality of storage nodes SN are connected to the source/drain regions 116B.

In the horizontal channel cell shown in FIG. 1, a horizontal-type channel length 'H-CH' is formed in the horizontal direction beneath the gate electrode 113.

However, in the DRAM devices using the horizontal-type cells with a gate width of 100 nm or lower, a cell size becomes smaller and a channel length of the cell becomes shorter. Accordingly, a refresh property of the DRAM devices gets degraded, and a gate width becomes smaller. As a result, an operation voltage of the cell can be difficult to control and cell current reduces.

SUMMARY OF THE INVENTION

The present invention provides a semiconductor device having a vertical-type channel capable of overcoming a limitation caused by a channel length according to a design rule and stably operating a cell by increasing a cell current.

In accordance with one embodiment of the present invention, a semiconductor device includes: an active region including a surface region and a first recess formed below the surface region, the active region extending along a first direction; a device isolation structure provided on an edge of the active region; a gate line traversing over the surface region of the active region along a second direction orthogonal to the first direction; a second recess formed in the device isolation structure to receive a given portion of the gate line into the second recess; a first junction region formed in the active region beneath the first recess and on a first side of the gate line; and a second junction region formed on a second side of the gate line and above the first junction region, wherein the first and second junction regions define a vertical-type channel that extends along lateral and vertical directions.

In accordance with another embodiment of the present invention, a semiconductor device includes: an active region including a surface region and first recesses formed on both sides of the surface region, the active region extending along a first direction; a device isolation structure surrounding the active region; a pair of gate lines extending along the surface region of the active region in a second direction perpendicular to the first direction; a plurality of second recesses formed in the device isolation structure beneath the gate lines and including given portions of the gate lines filled into the second recesses; a plurality of first junction regions formed in the active region beneath the first recesses; and a second junction region formed in the surface region between the gate lines, wherein the second junction region defines at least two vertical-type channels below the gate line with the plurality of first junction regions.

In accordance with still another embodiment of the present invention, a method for fabricating a semiconductor device includes: forming a device isolation structure within a trench type to define an active region on a substrate; etching portions where gate lines traverse in the device isolation structure to a certain depth to form a plurality of first recesses; forming a pair of gate lines filling the first recesses and traversing over the active region; etching a portion of the active region between the gate lines to a certain depth to form a second recess; and performing an ion-implantation process to form a first junction region beneath the second recess and to form second junction regions on sides of the gate lines in a surface region of the active region.

In accordance with another embodiment of the present invention, a method for fabricating a semiconductor device includes: forming a device isolation layer with a trench type in a predetermined portion of a substrate to define an active region; etching predetermined portions where gate lines traverse in the device isolation layer to a certain depth to form a plurality of first recesses; forming a pair of gate lines filling the first recesses and traversing over the active region; etching portions of the active region which storage nodes contact on one sides of the gate lines to form a plurality of second recesses; and performing an ion-implantation process to form a plurality of first junction regions beneath the second recesses and to form a second junction region in a portion of the active region between the gate lines, the second junction region contacting bit lines.

In accordance with yet another embodiment, a semiconductor device includes an active region including a surface region and a first recess formed below the surface region, the active region extending along a first direction. A device isolation structure is provided on an edge of the active region. A gate line traverses over the surface region of the active region along a second direction orthogonal to the first direction. A second recess is formed in the device isolation structure to receive a given portion of the gate line into the second recess. A first junction region is formed in the active region beneath the first recess and on a first side of the gate line. A second junction region is formed on a second side of the gate line and above the first junction region. The first and second junction regions define a vertical-type channel that extends along lateral and vertical directions.

BRIEF DESCRIPTION OF THE DRAWINGS

The above and other features of the present invention will become better understood with respect to the following description of the embodiments given in conjunction with the accompanying drawings, in which.

DETAILED DESCRIPTION OF THE INVENTION

Figure 1:
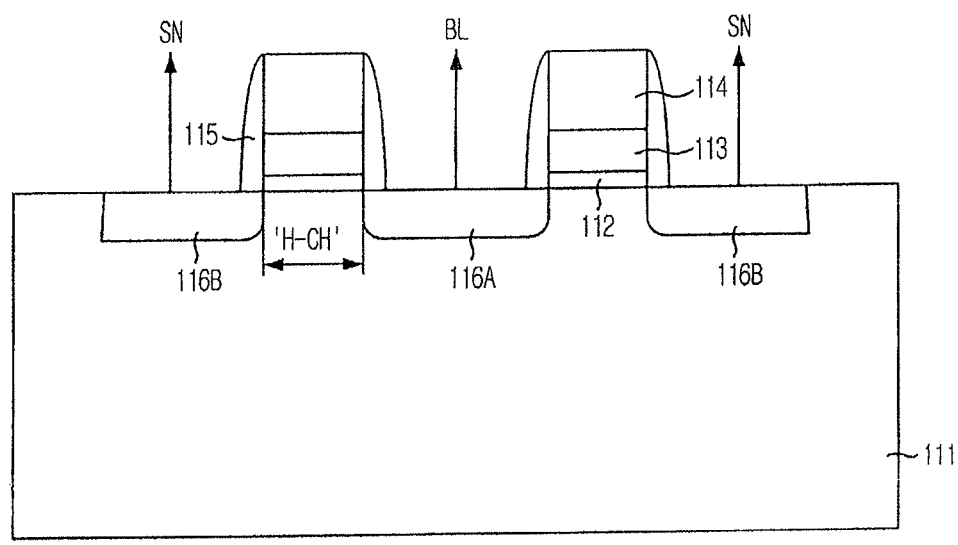
FIG. 1 illustrates a cross-sectional view of a conventional cell having a horizontal-type channel.
Figure 2:
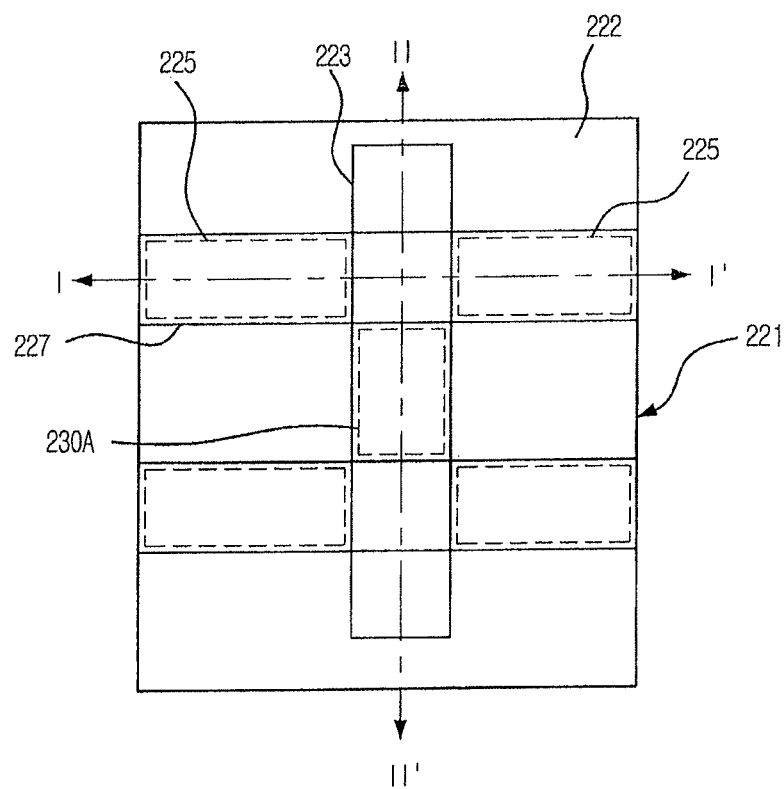
FIG. 2 shows a top view of a cell having a vertical-type channel in accordance with a first embodiment of the present invention.
Figure 3A:
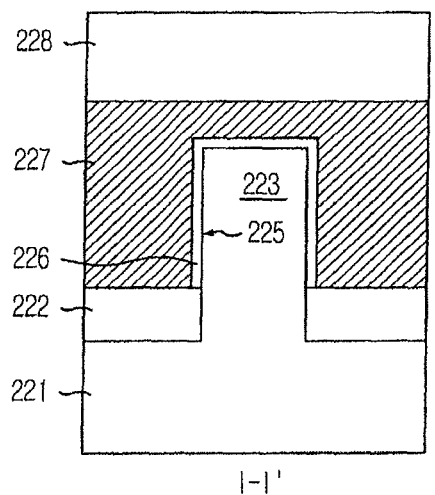
FIG. 3A describes a cross-sectional view of the cell taken along a line I-I' in FIG. 2.

FIG. 2 shows a top view of a cell having a vertical-type channel in accordance with a first embodiment of the present invention. FIG. 3A describes a cross-sectional view of the cell taken along a line I-I' in FIG. 2 and FIG. 3B provides a cross-sectional view of the cell taken along a line II-II' in FIG. 2.

Hereinafter, a semiconductor memory device having a vertical-type channel that defines a significant vertical current path will be referred to as "vertical channel device". The vertical channel device comprises a plurality of storage cells, e.g., millions of cells. Accordingly, the term "vertical channel cell" is used to refer to a portion of the vertical channel device.

Figure 3B:
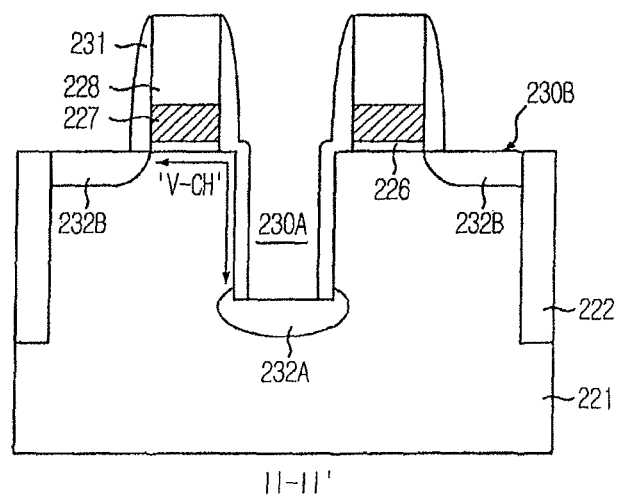
FIG. 3B provides a cross-sectional view of the cell taken along a line II-II' in FIG. 2.

Referring to FIG. 2 and FIGS. 3A and 3B, the vertical channel device is defined on a semiconductor substrate 221. The vertical channel device includes an active region 223 having a plurality of surface regions 230B and a first recess 230A lower than the surface regions 230B. The surface region 230B defines an upper surface of the substrate 221 in the present embodiment. The first recess 230A is formed by etching a trench of a given depth in the substrate 221.

The vertical channel device includes a device isolation layer 222 surrounding the active region 223, at least one pair of gate electrodes (also known as gate lines) 227 traversing over the surface region 230B of the active region 223 in the direction perpendicular to the active region 223, a plurality of second recesses 225 formed in the device isolation layer 222 beneath the gate electrodes 227 and including portions of the gate electrodes 227 filling the second recesses 225.

A bit line junction region 232A is formed in the active region 223 beneath the first recess region 230A and contacting a bit line. A plurality of storage node junction regions 232B are formed in the surface region 230B on one side of the corresponding gate electrodes 227 and contacting a storage node.

A plurality of gate spacers 231 are formed over sidewalls of the gate lines. A gate oxide layer 226 is formed beneath the gate electrode 227 and over the substrate 221. A gate hard mask 228 is formed above the gate electrode 227.

In the above described structure, the vertical-type channel length 'V-CH' of the vertical channel device is defined between the bit line junction region 232A and the storage node junction region 232B beneath the gate electrode 227.

FIGS. 4A to 4E are cross-sectional views illustrating a method for fabricating a semiconductor device having the cell shown in FIGS. 2 to 3B. The cross-sectional views associated with a line I-I' in FIG. 2 are provided on the left side. The cross-sectional views associated with a line II-II' in FIG. 2 are provided on the right side.

Figure 4A:
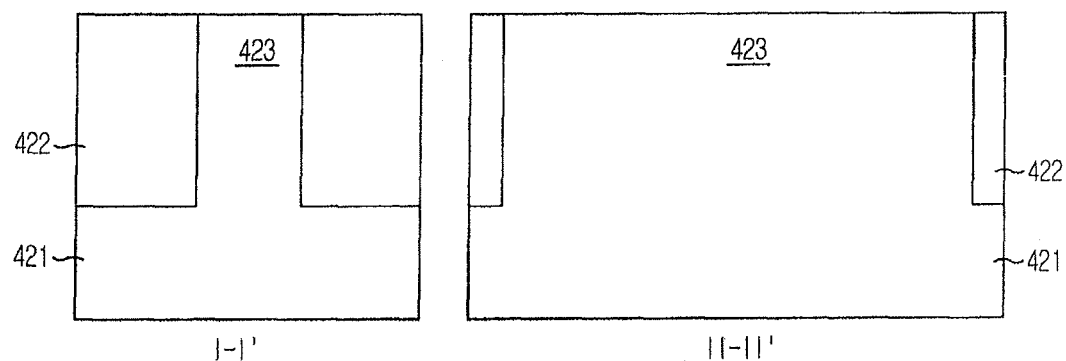
FIGS. 4A to 4E are cross-sectional views illustrating a method for fabricating the cell shown in FIGS. 2 to 3B.

As shown in FIG. 4A, a plurality of trench type device isolation layers 422 are formed in a substrate 421. An active region 423 is defined by the device isolation layers 422. The active region is formed in an island type by using a shallow trench isolation (STI) process.

Figure 4B:
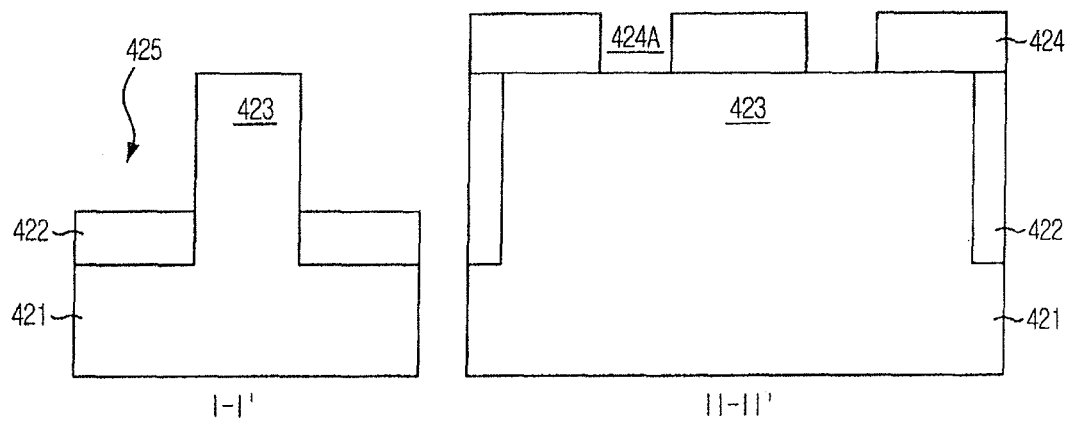

As shown in FIG. 4B, a photoresist layer is formed over the above resulting structure and patterned by performing a photo-exposure process and a developing process to form a first photoresist pattern 424. The first photoresist pattern 424 is a mask formed by reversing a gate mask to pattern a subsequent gate electrode and traverses an upper portion of the active region 423. Accordingly, a plurality of first openings 424A between the first photoresist pattern 424 has a line type structure exposing a portion where a subsequent gate electrode is to be formed.

Predetermined portions of the device isolation layers 422 exposed by the first openings 424A by using the first photoresist pattern 424 as an etch mask are etched to form a plurality of first recesses 425. The etching process to form the first recesses 425 is performed by using a gas selectively etching the device isolation layers 422 which are formed with an oxide-based layer. For instance, a fluorocarbon-based gas selected from a group comprising tetrafluoromethane ($CF_4$), octafluoropropane ($C_3F_8$) and trifluoromethane ($CHF_3$) can be used. Since the gas used in the etching process to form the first recesses 425 needs to have a high etch selectivity to a silicon-based active region 423, $C_3F_8$ or $CHF_3$ can also be used.

Figure 4C:
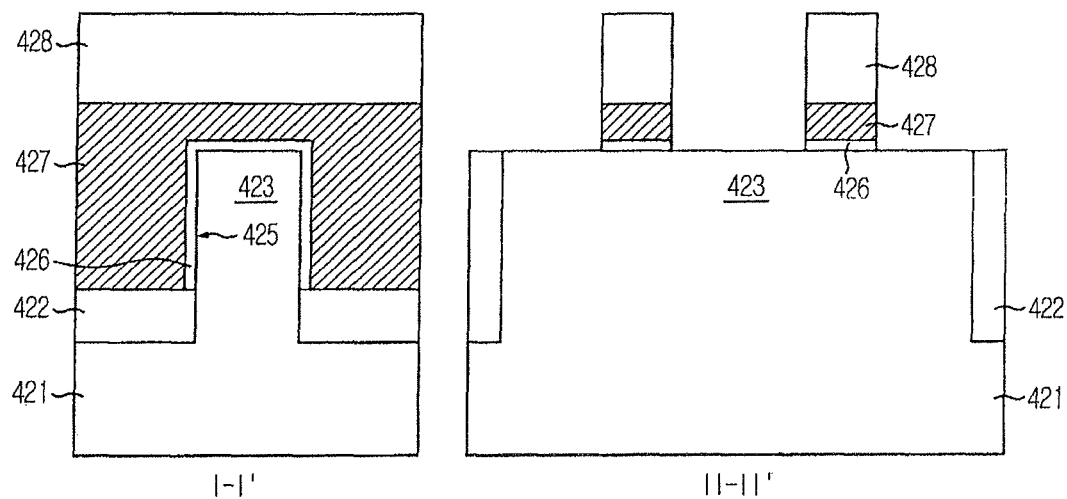

As shown in FIG. 4C, the first photoresist pattern 424 is stripped and a gate oxide layer 426 is formed. Then, a plurality of gate electrodes 427 and a plurality of gate hard masks 428 are sequentially formed over the first recesses 425 and afterwards, a gate patterning process is performed to form a plurality of line type gate lines traversing over the active region 423.

The gate electrodes 427 are formed with polysilicon or a stack structure of polysilicon and tungsten silicide. The gate electrodes 427 sufficiently fill the first recesses 425, and a planarization process can be additionally performed. The gate hard masks 428 are formed with a silicon nitride layer over the planarized gate electrodes 427.

During forming the above described gate lines, since the gate electrodes 427 are formed with a structure filling the first recesses 425, each of the gate electrodes 427 covers two sidewalls of the active region 423 and a top surface of the active region 423.

Figure 4D:
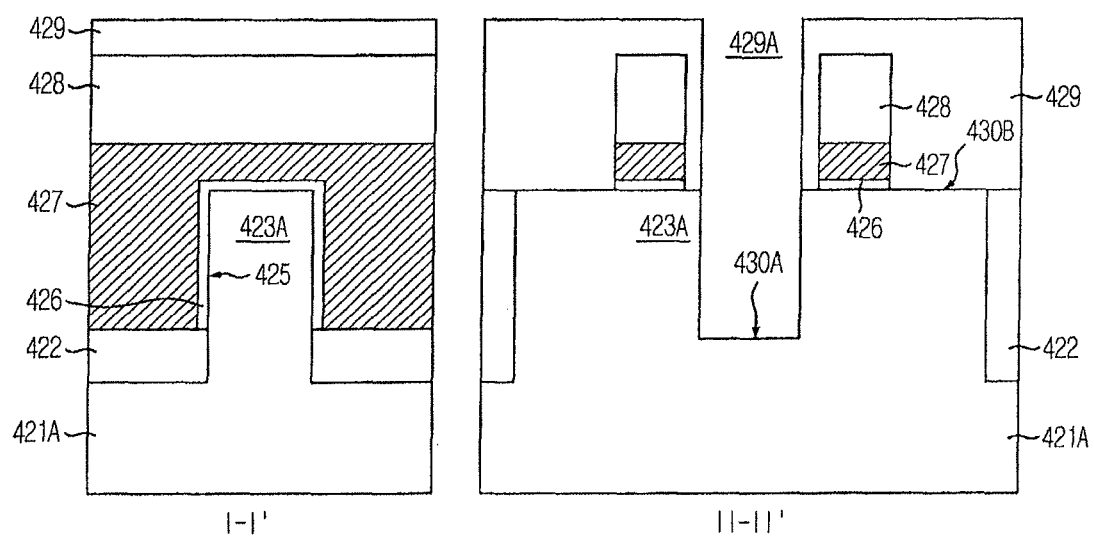

As shown in FIG. 4D, a photoresist layer is formed over the above resulting structure including the gate lines, and patterned by using a photo-exposure process and a developing process to form a second photoresist pattern 429 exposing a surface of the active region 423 between the gate lines. A second opening 429A of the second photoresist pattern 429 is formed with a structure exposing at least one side of the gate line or in a line type which does not expose the gate line. A substrate and an active region exposed by the second opening 429A are provided with reference numerals 421A and 423A respectively. Accordingly, the second photoresist pattern 429 covers the other side of the gate line or a top surface of the gate line, and exposes a surface of the exposed active region 423A between the gate lines and a predetermined portion of the device isolation layers 422 contacting the active region 423.

The exposed active region 423A is etched to a predetermined thickness by using the second photoresist pattern 429 as an etch mask to form a second recess 430A. Although explained later, a bottom portion of the second recess 430A will be a region contacting a bit line, and a plurality of surface region 430B of the exposed active region 423A except for the second recess 430A will be a region contacting a storage node. The second recess 430A has a major axis and a minor axis. The second recess 430A exposes the sidewalls of the device isolation layers 422 in the direction of the major axis, and the sidewalls of the exposed active region 423A in the direction of the minor axis.

In some embodiments, the second recess 430A is formed more thinly than the first recess 425 in which the gate electrode 427 is filled to reduce a leakage current.

As a result, the second recess 430A is formed with a predetermined thickness between the gate lines. A space between the gate lines represents a region where a bit line will be formed. Since the etching process to form the second recess 430A selectively etches the substrate 421 formed with a silicon material, hydrogen bromide (HBr) or chlorine ($Cl_2$) gas can be used.

Figure 4E:
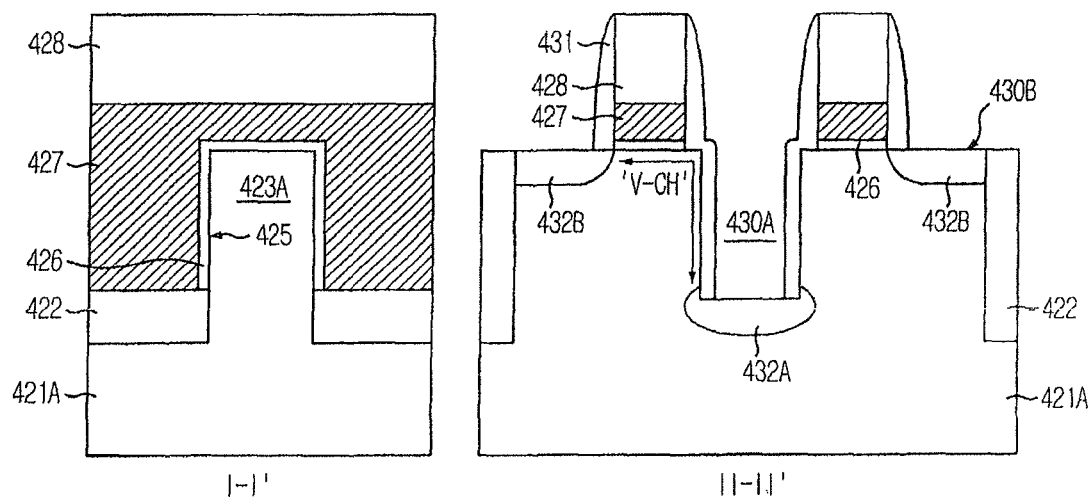

As shown in FIG. 4E, the second photoresist pattern 429 is stripped to form a plurality of gate spacers 431 on sidewalls of the gate lines. More specifically, a silicon nitride layer is formed and then, subjected to an etch-back to form the gate spacers 431. On one side of each of the gate lines contacting the second recess 430A, the gate spacers 431 cover not only the sidewalls of the gate lines but also the sidewalls of the second recess 430A. In an upper portion of the surface region 430B, the spacers 431 cover the sidewalls of the gate lines.

An ion-implantation process using an ion-implantation barrier further comprising the gate lines and the gate spacers 431, or a separate ion-implantation mask (not shown) is performed to form a plurality of source/drain regions. The source/drain region formed by performing an ion-implantation process to a bottom portion of the second recess 430A becomes a region where a subsequent bit line contacts and thus, will be referred to as a bit line junction region 432A. The source/drain regions formed by performing the ion-implantation process to the surface region 430A of the exposed active region 423A become regions where subsequent storage nodes contact and thus, will be referred to as storage node junction regions 432B. In some embodiments, the bit line junction region 432A and the storage node junction regions 432B are doped with N-type impurities.

As described above, the bit line junction region 432A and the storage node junction regions 432B are formed between the gate lines to form a cell transistor. A channel region is defined beneath a surface of the exposed active region 423A between the bit line junction region 432A and the respective storage node junction regions 432B. As illustrated, the channel region has a channel length 'V-CH'. The channel length 'V-CH' is longer than the conventional horizontal-type channel, i.e., by the depth of the second recess 430A. Furthermore, in the conventional horizontal-type cell, a cell region is defined along the horizontal direction; however, in this embodiment of the present invention, the cell region is formed along two directions (i.e., in a horizontal direction and a vertical direction) to form a vertical-type structure to increase the size of the cell region.

Figure 5A:
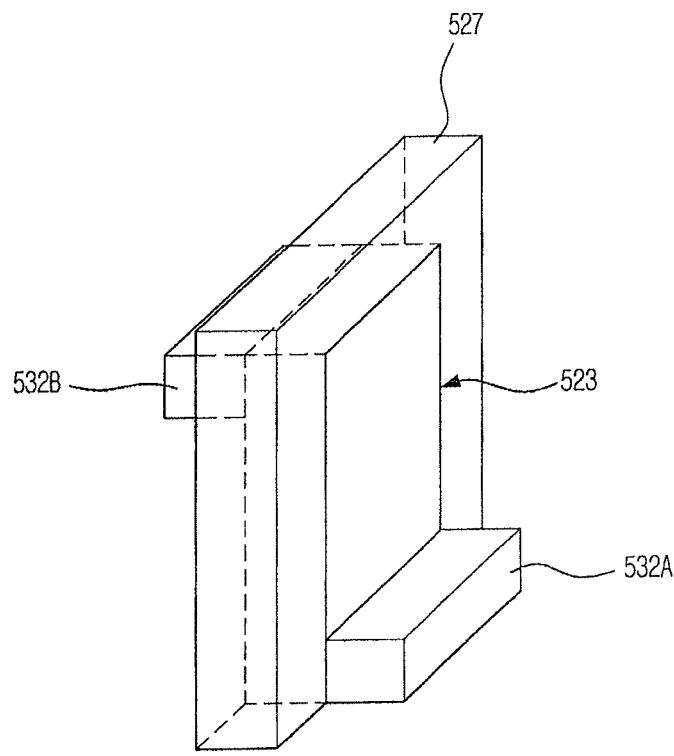
FIG. 5A illustrates a perspective view of the cell shown in FIG. 4E.
Figure 5B:
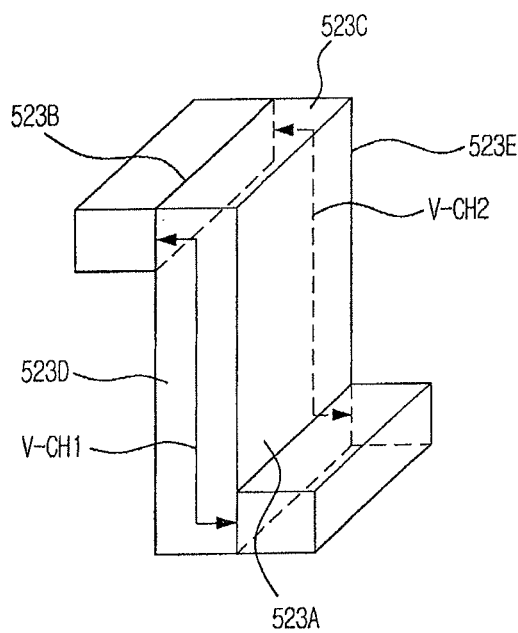
FIG. 5B represents a perspective view of a vertical-type channel shown in FIG. 4E.

FIG. 5A illustrates a perspective view of the cell structure of the semiconductor device shown in FIG. 4E. FIG. 5B represents a perspective view of the vertical-type channel shown in FIG. 4E.

As shown in FIGS. 5A and 5B, an active region 523 includes a first sidewall 523A contacting a bit line junction region 532A, a second sidewall 523B contacting a storage node junction region 532B, and a top surface 523C, a third sidewalls 523D, and a fourth sidewall 523E contacting a gate electrode 527.

The gate electrode 527 covers the top surface 523C, the third sidewall 523D, and the fourth sidewall 523E of the active region 523. The bit line junction region 532A and the storage node junction region 532B are contacting the first sidewall 523A and the second sidewall 523B, respectively.

A vertical-type channel is formed with a first channel V-CH1 (see the arrow on the third sidewall 523D) and a second channel V-CH2 (see the arrow on the fourth sidewall 523E).

A portion of a device isolation layer where a gate line traverses is etched to a predetermined thickness to form a first recess. A gate electrode contacts a sidewall of the first recess. A region between the gate lines in which a bit line will contact is etched to a predetermined thickness to form a second recess. An ion-implantation process is performed to the second recess to form a bit line junction region. Accordingly, a vertical-type channel can be formed.

Furthermore, a vertical-type channel cell includes two channel structures. The vertical-type channel cell uses two sidewalls of an active region which the first recess provides as channels thereof. Accordingly, a cell current can be increased and as a result, a depth of an active region can be reduced to reduce a cell operation voltage.

Figure 6:
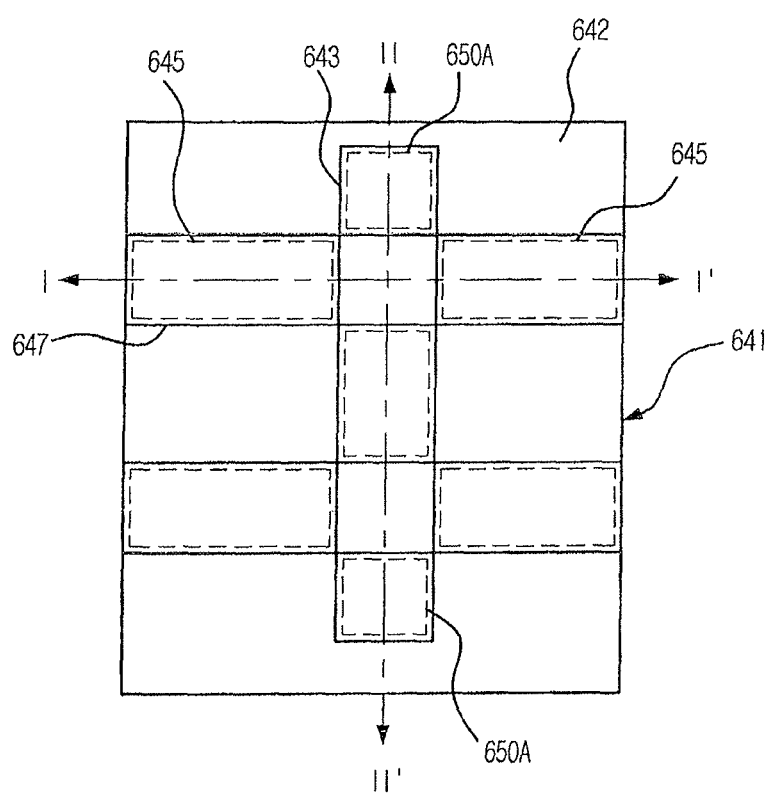
FIG. 6 shows a top view of a cell having a vertical-type channel in accordance with a second embodiment of the present invention.
Figure 7A:
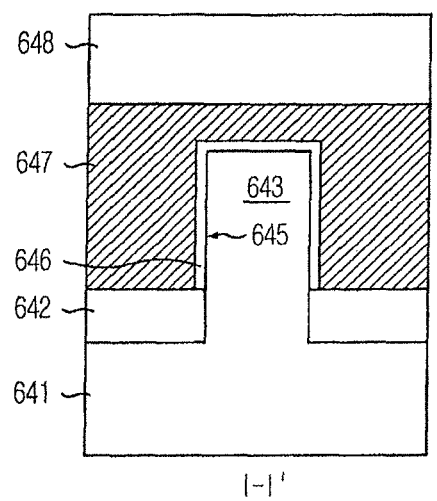
FIG. 7A provides a cross-sectional view of the cell taken along a line I-I' in FIG. 6.

FIG. 6 shows a top view of a vertical channel device having a vertical-type channel in accordance with a second embodiment of the present invention. FIG. 7A provides a cross-sectional view of a cell taken along a line I-I' in FIG. 6 and FIG. 7B describes a cross-sectional view of the cell taken along a line II-II' in FIG. 6.

Figure 7B:
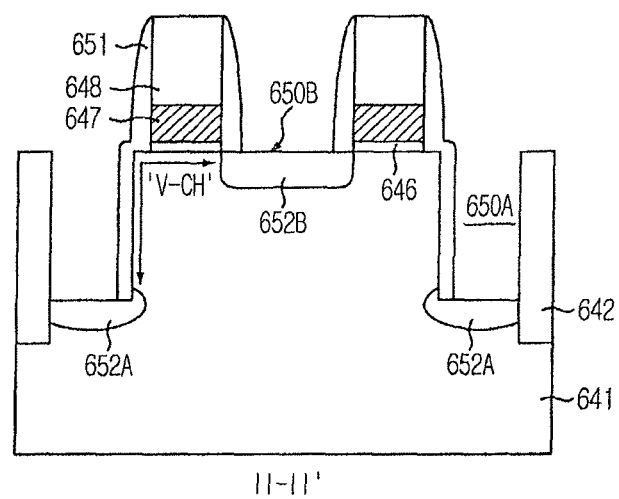
FIG. 7B describes a cross-sectional view of the cell taken along a line II-II' in FIG. 6.

Referring to FIG. 6 and FIGS. 7A and 7B, the vertical channel device includes an active region 643 having a surface region 650B and a plurality of first recesses 650A lower than the surface region 650B, a device isolation layer 642 surrounding the active region 643, at least one pair of gate electrodes (also known as gate lines) 647 traversing over the surface region 650B of the active region 643 in the direction perpendicular to the active region 643, a plurality of second recesses 645 formed in the device isolation layer 642 beneath the gate electrodes 647 and including portions of the gate electrodes 647 filling the second recesses 645, a plurality of storage node junction regions 652A formed in the active region 643 beneath the first recesses 650A and contacting a storage node, and a bit line junction region 652B formed in the surface region 650B on one side of the gate electrodes 647 and contacting a bit line.

A plurality of gate spacers 651 are formed over sidewalls of the gate lines. A gate oxide layer 646 is formed beneath the gate electrode 647. A gate hard mask 648 is formed above the gate electrode 647.

In the above described structure, the vertical-type channel length 'V-CH' is formed between the bit line junction region 652B and the storage node junction region 652A beneath the gate electrode 647.

FIGS. 8A to 8E are cross-sectional views illustrating a method for fabricating the device shown in FIGS. 6 to 7B. The cross-sectional views associated with a line I-I' in FIG. 6 are provided on the left side. The cross-sectional views associated with a line II-II' in FIG. 6 are provided on the right side.

Figure 8A:
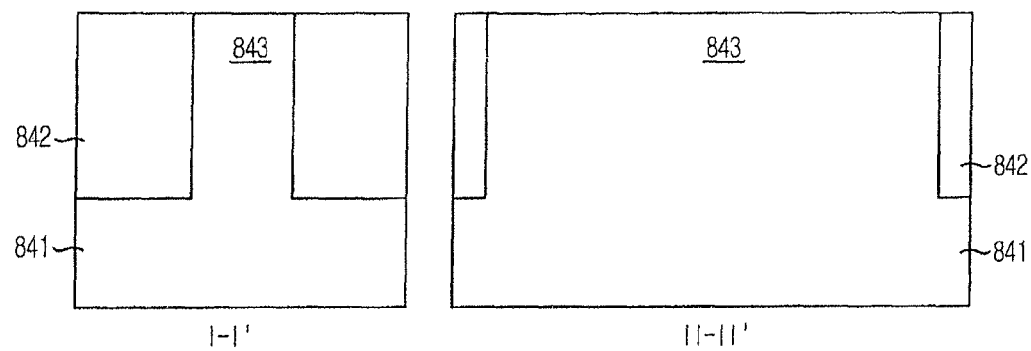
FIGS. 8A to 8E are cross-sectional views illustrating a method for fabricating the cell shown in FIGS. 6 to 7B.

As shown in FIG. 8A, a plurality of trench type device isolation layers 842 are formed in a substrate 841. An active region 843 is defined by the device isolation layers 842. The active region 843 is formed in an island type by using a shallow trench isolation (STI) process.

Figure 8B:
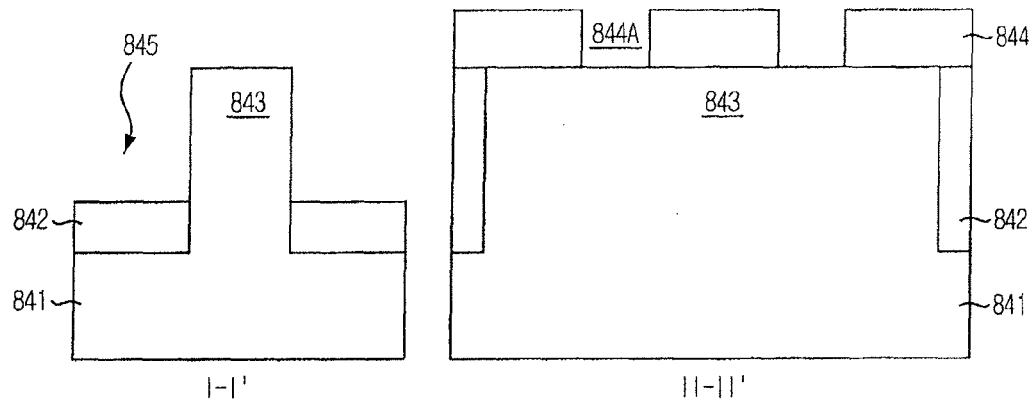

As shown in FIG. 8B, a photoresist layer is formed over the above resulting structure and patterned by performing a photo-exposure process and a developing process to form a first photoresist pattern 844. The photoresist pattern 844 is a mask formed by reversing a gate mask to pattern a subsequent gate electrode and traverses an upper portion of the active region 843. Accordingly, a plurality of first openings 844A between the first photoresist pattern 844 has a line type structure exposing a portion where a subsequent gate electrode is to be formed.

Predetermined portions of the device isolation layers 842 exposed by the first openings 844A by using the first photoresist pattern 844 as an etch mask are etched to form a plurality of first recesses 845. The etching process to form the first recesses 845 is performed by using a gas selectively etching the device isolation layers 842 which are formed with an oxide-based layer. For instance, a fluorocarbon-based gas selected from a group comprising tetrafluoromethane ($CF_4$), octafluoropropane ($C_3F_8$) and trifluoromethane ($CHF_3$) can be used. Since the gas used in the etching process to form the first recesses 845 needs to have a high etch selectivity to a silicon-based active region 843, $C_3F_8$ or $CHF_3$ can also be used.

Figure 8C:
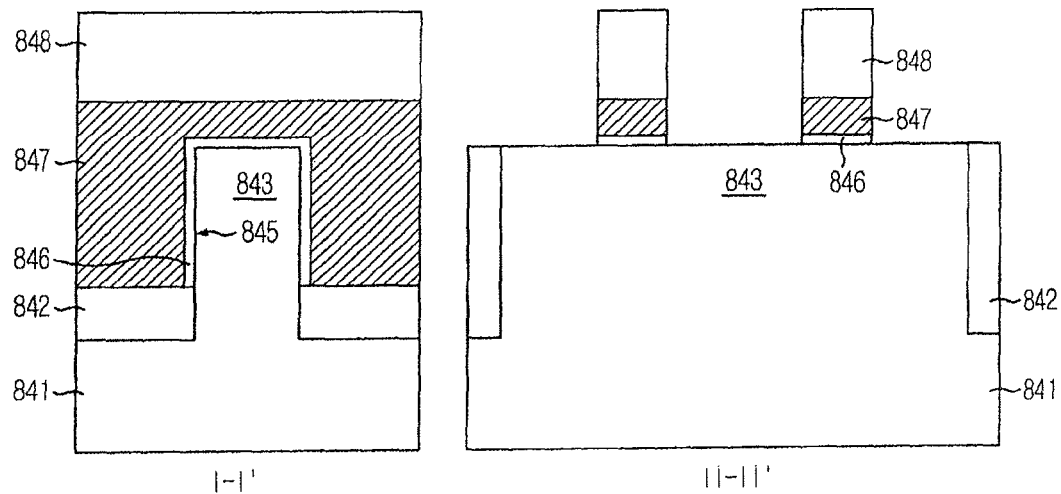

As shown in FIG. 8C, the first photoresist pattern 844 is stripped and a gate oxide layer 846 is formed. Then, a plurality of gate electrodes 847 and a plurality of gate hard masks 848 are sequentially formed over the first recesses 845 and afterwards, a gate patterning process is performed to form a plurality of line type gate lines traversing over the active region 843.

The gate electrodes 847 are formed with polysilicon or a stack structure of polysilicon and tungsten silicide. The gate electrodes 847 sufficiently fill the first recesses 845, and a planarization process can be additionally performed. The gate hard masks 848 are formed with a silicon nitride layer over the planarized gate electrodes 847.

During forming the above described gate lines, since the gate electrodes 847 fills the first recesses 845, each of the gate electrodes 847 covers two sidewalls of the active region 843 and a top surface of the active region 843.

Figure 8D:
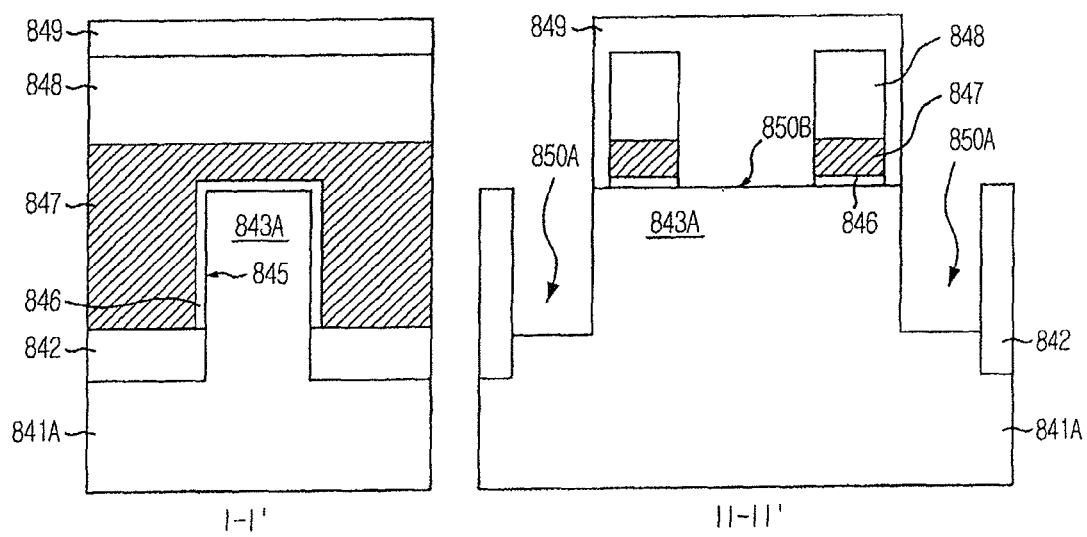

As shown in FIG. 8D, a photoresist layer is formed over the above resulting structure including the gate lines, and patterned by using a photo-exposure process and a developing process to form a second photoresist pattern 849 exposing surfaces of the active region 843 between the gate lines. A plurality of second openings 849A of the second photoresist pattern 849 are formed with a structure exposing at least one side of the gate line or in a line type which does not expose the gate line. A substrate and an active region exposed by the second openings 849A are provided with reference numerals 841A and 843A respectively. Accordingly, the second photoresist pattern 849 covers the other side of the gate line or a top surface of the gate line, and exposes a surface of the exposed active region 843A between the gate lines and a predetermined portion of the device isolation layers 842 contacting the exposed active region 843A.

The exposed active region 843A is etched to a predetermined thickness by using the second photoresist pattern 849 as an etch mask to form a plurality of second recesses 850A. Although explained later, bottom portions of the second recesses 850A will be regions contacting storage nodes, and a surface region 850B of the exposed active region 843A except for the second recesses 850A will be regions contacting a bit line.

In some embodiments, the second recess 850A is formed more thinly than the first recess 845 in which the gate electrode 847 is filled to reduce a leakage current.

As a result, each of the second recesses 850A is formed with a predetermined thickness on one side of each of the gate electrodes 847. The regions where the second recesses 850A are formed represent regions where storage nodes will be formed. Since the etching process to form the second recesses 850A selectively etches the substrate 841 formed with a silicon material, hydrogen bromide (HBr) or chlorine ($Cl_2$) gas can be used.

Figure 8E:
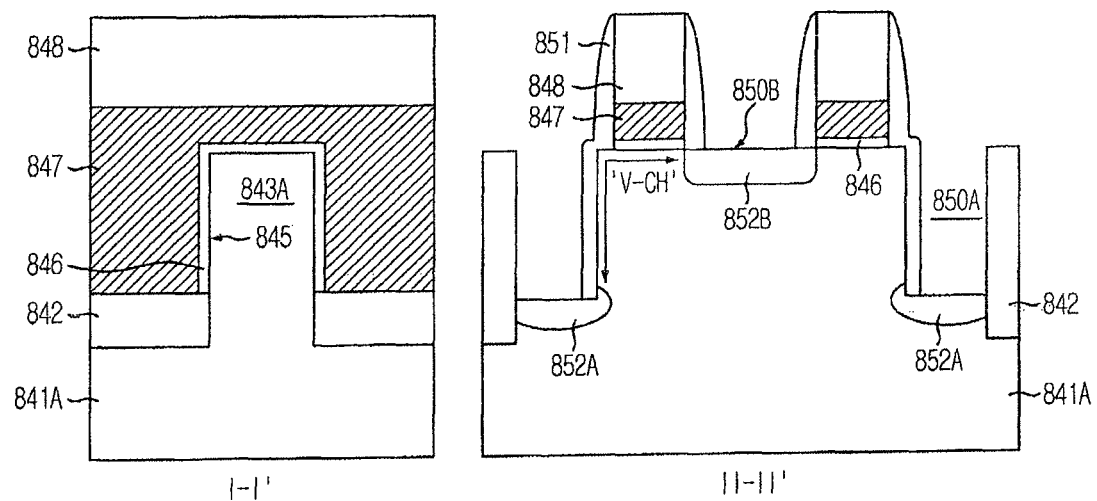

As shown in FIG. 8E, the second photoresist pattern 849 is stripped to form a plurality of gate spacers 851 on sidewalls of the gate lines. More specifically, a silicon nitride layer is formed and then, subjected to an etch-back to form the gate spacers 851. In lateral sides of the gate lines contacting the second recesses 850A, the gate spacers 851 cover not only the sidewalls of the gate lines but also the sidewalls of the second recesses 850A. In an upper portion of the surface region 850B with which the bit line will contact, the spacers 850 cover the sidewalls of the gate lines.

An ion-implantation process using an ion-implantation barrier further comprising the gate lines and the gate spacers 851, or a separate ion-implantation mask (not shown) is performed to form a plurality of source/drain regions. The source/drain regions formed by performing an ion-implantation process to bottom portions of the second recesses 850A become regions where subsequent storage nodes contact and thus, will be referred to as storage node junction regions 852A. The source/drain region formed by performing the ion-implantation process to the surface region 850B of the exposed active region 843A become a region where a subsequent bit line contacts and thus, will be referred to as a bit line junction region 852B. In some embodiments, the bit line junction region 852B and the storage node junction regions 852A are doped with N-type impurities.

As described above, the bit line junction region 852B and the storage node junction regions 852A are formed between the gate lines to form a cell transistor. A channel region is defined beneath a surface of the active region 843 between the bit line junction region 852B and the respective storage node junction regions 852A. As illustrated, the channel region has a channel length 'V-CH'. The channel length 'V-CH' is longer than that of the conventional horizontal-type cell by the depth of the second recess 850A. The conventional horizontal-type cell has a cell region defined along the horizontal direction; however, in this embodiment of the present invention, the cell region is defined along two directions (i.e., along horizontal and vertical directions) to form a vertical-type structure to increase the size of the cell region.

Figure 9A:
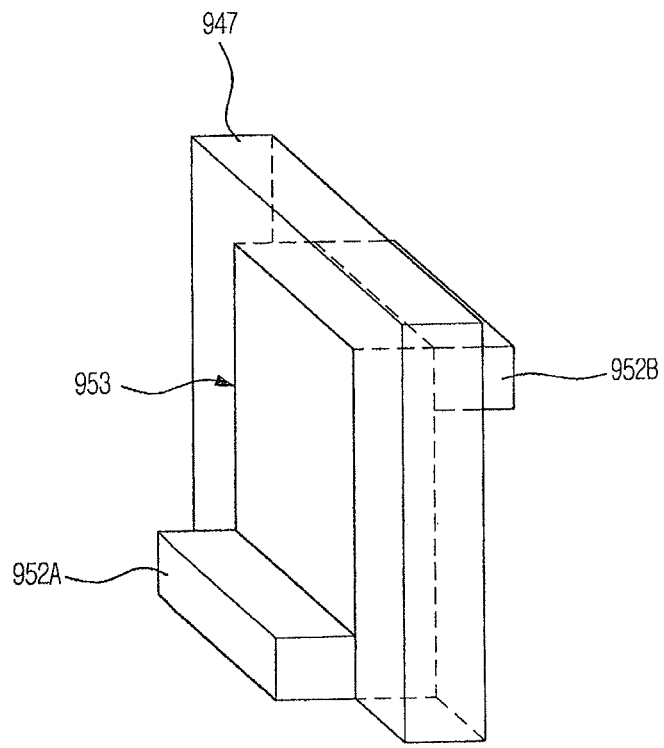
FIG. 9A illustrates a perspective view of the cell structure having a vertical-type channel shown in FIG. 8E.
Figure 9B:
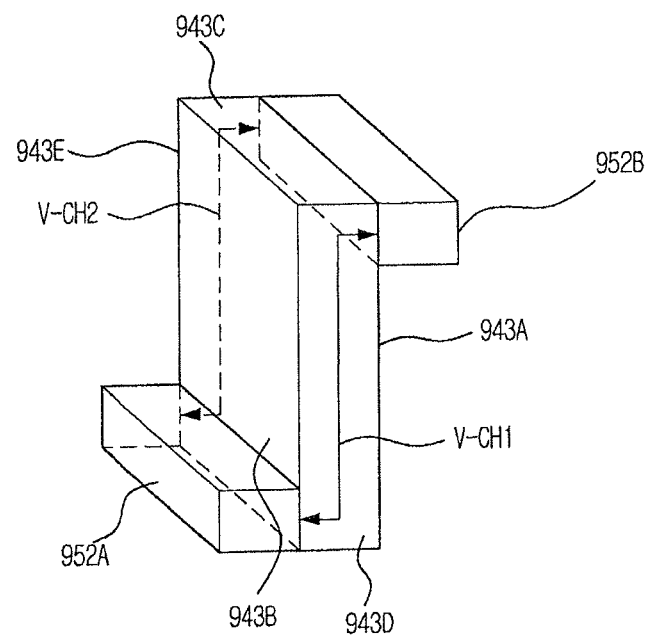
FIG. 9B shows a perspective view of the vertical-type channel shown in FIG. 8E.

FIG. 9A illustrates a perspective view of the cell structure having the vertical-type channel shown in FIG. 8E. FIG. 9B represents a perspective view of the vertical-type channel shown in FIG. 8E.

As shown in FIGS. 9A and 9B, an active region 953 includes a first sidewall 943A contacting a bit line junction region 952B, a second sidewall 943B contacting a storage node junction region 952A, and a top surface 943C, a third sidewalls 943D, and a fourth sidewall 943E contacting a gate electrode 947.

The gate electrode 947 covers the top surface 943C, the third sidewall 943D, and the fourth sidewall 943E of the active region 943. The bit line junction region 952B and the storage node junction region 952A are contacting the first sidewall 943A and the second sidewall 943B, respectively.

A vertical-type channel is formed with a first channel V-CH1 (see the arrow on the third sidewall 943D) and a second channel V-CH2 (see the arrow on the fourth sidewall 943E).

In this embodiment of the present invention, a portion of a device isolation layer where a gate line traverses is etched to a predetermined thickness to form a first recess. A gate electrode is contacting a sidewall of the first recess. A region between the gate lines which a bit line will contact is etched to a predetermined thickness to form a second recess. An ion-implantation process is performed to the second recess to form a bit line junction region. Accordingly, a vertical-type channel can be formed.

Furthermore, a vertical-type channel cell includes two channel structures. The vertical-type channel cell uses two sidewalls of an active region which the first recess provides as channels thereof Accordingly, a cell current can be increased and as a result, a depth of an active region can be reduced to reduce a cell operation voltage.

In accordance with the embodiment of the present invention, a channel of a cell is formed in the vertical direction. The channel length can be increased, and the refresh property can be improved.

Furthermore, a channel is formed through two sidewalls of an active region. Accordingly, a cell current can be increased, and a depth of the active region can be decreased to reduce a cell operation voltage. As a result, a cell can stably operate.

The present application contains subject matter related to the Korean patent application No. KR 2005-0132568, filed in the Korean Patent Office on Dec. 28, 2005 the entire contents of which being incorporated herein by reference.

While the present invention has been described with respect to certain embodiments, it will be apparent to those skilled in the art that various changes and modifications may be made without departing from the spirit and scope of the invention as defined in the following claims.

What is claimed is:

1. A semiconductor device, comprising:
an active region including a surface region and a first recess, the active region extending along a first direction, wherein the first recess is formed below the surface region;
a device isolation structure provided on an edge of the active region;
a gate line traversing over the surface region of the active region along a second direction orthogonal to the first direction;
a second recess formed in the device isolation structure to receive a given portion of the gate line into the second recess, wherein the second recess does not overlap with the first recess;
a first junction region formed in the active region beneath the first recess and on a first side of the gate line; and
a second junction region formed on a second side of the gate line and above the first junction region,
wherein the first and second junction regions define a vertical-type channel that extends along lateral and vertical directions.

2. The semiconductor device of claim 1, wherein the second recess is formed on both sides of the active region beneath the gate lines.

3. The semiconductor device of claim 1, wherein the second junction is formed on the surface region of the active region.

4. The semiconductor device of claim 1, wherein the first junction region contacts a bit line, and the second junction region contacts a storage node.

5. The semiconductor device of claim 4, wherein the first junction region and the second junction regions are doped with N-type impurities.

6. The semiconductor device of claim 1, wherein a depth of the first recess is less than that of the second recess, and the depth of the second recess is less than that of the device isolation structure.

* * * * *